United States Patent
Shoup et al.

(10) Patent No.: US 6,235,402 B1
(45) Date of Patent: *May 22, 2001

(54) BUFFER LAYERS ON BIAXIALLY TEXTURED METAL SUBSTRATES

(75) Inventors: Shara S. Shoup, Woodstock, GA (US); Mariappan Paranthamam, Knoxville, TN (US); David B. Beach, Knoxville, TN (US); Donald M. Kroeger, Knoxville, TN (US); Amit Goyal, Knoxville, TN (US)

(73) Assignee: UT-Battelle, LLC, Oak Ridge, TN (US)

(*) Notice: Subject to any disclaimer, the term of this patent is extended or adjusted under 35 U.S.C. 154(b) by 0 days.

This patent is subject to a terminal disclaimer.

(21) Appl. No.: 09/248,300

(22) Filed: Feb. 11, 1999

Related U.S. Application Data

(60) Division of application No. 08/922,173, filed on Sep. 2, 1997, now Pat. No. 6,077,344, and a continuation-in-part of application No. 08/419,583, filed on Apr. 10, 1995, now Pat. No. 5,741,377.

(51) Int. Cl.[7] .................................................... B32B 15/04
(52) U.S. Cl. ...................... 428/472; 428/469; 428/471; 428/697; 428/700; 428/701; 428/702; 117/944
(58) Field of Search ................................ 428/469, 471, 428/472, 689, 701, 697, 700, 702; 505/236, 239; 117/944, 945

(56) References Cited

U.S. PATENT DOCUMENTS

| | | | |
|---|---|---|---|
| 5,146,299 | * 9/1992 | Lampe et al. | 357/23.5 |
| 5,159,413 | * 10/1992 | Calviello et al. | 505/1 |
| 5,198,269 | * 3/1993 | Swartz et al. | 427/226 |
| 5,432,151 | * 7/1995 | Russo et al. | 505/474 |
| 5,470,668 | * 11/1995 | Wu et al. | 428/688 |
| 5,585,694 | * 12/1996 | Goldburt et al. | 313/491 |
| 5,741,377 | * 4/1998 | Goyal et al. | 148/512 |
| 5,968,877 | * 10/1999 | Budai et al. | 505/237 |
| 6,077,344 | * 6/2000 | Shoup et al. | 117/9 |

OTHER PUBLICATIONS

J.V. Cathcart, et al., "The structure of Thin Oxide Films Formed on Nickel Crystals", *J. Electrochem. Soc.* 116:664–668, 1969. (no month).

A. Goyal, et al., "High Critical Current Density Superconducting Tapes by Epitaxial Deposition of $YBa_2Cu_3O_x$ Thick Films on Biaxially Textured Metals", *Appl. Phys. Lett.* 69(12):1795–1797, 1996, (no month).

K. Kushida, et al., "Origin of Orientation on Sol–Gel–Derived Lead Titanate Films", *J. Am. Ceram. Soc.* 76(5):1345–1348, 1993, (no month).

A.E. Lee, et al., "Epitaxially Grown Sputtered $LaAlO_3$ Films", *Appl. Phys. Lett.* 57(19):2019–2021, 1990, (no month).

P. Peshev and V. Slavova, "Preparation of Lanthanum Aluminate Thin Films by a Sol–Gel Procedure using Alkoxide Precursors", *Mater. Res. Bull.* 29(3):255–261, 1994, (no month).

(List continued on next page.)

Primary Examiner—Deborah Jones
Assistant Examiner—Stephen Stein
(74) Attorney, Agent, or Firm—Akerman, Senterfitt & Edison, P.A.

(57) ABSTRACT

A method is disclosed for forming a biaxially textured buffer layer on a biaxially oriented metal substrate by using a sol-gel coating technique followed by pyrolyzing/annealing in a reducing atmosphere. This method is advantageous for providing substrates for depositing electronically active materials thereon.

5 Claims, 7 Drawing Sheets

OTHER PUBLICATIONS

V. Sandu, et al., LaAlO$_3$ Thin Films Deposited on Silicon and Sapphire as Buffer Layers for YBa$_2$Cu$_3$O$_{7-x}$, *J. Mater. Sci. Lett.* 13:1222–1225, 1994, (no month).

S.S. Shoup, et al., "Growth of Epitaxial LaAlO$_3$ and CeO$_2$ Films using Sol–Gel Precursors", *Proceedings of the 10th Anniversary HTS Workshop on Physics, Materials and Applications* pp. 134–135, 1996, (no month).

S.S. Shoup, et al., "Sol–Gel Synthesis of LaAlO$_3$; Epitaxial Growth of LaAlO$_3$ Thin Films on SrTiO$_3$ (100)," *J. Mater. Res.* 12 (4): 1017–1021, 1997, (no month).

X.D. Wu, et al., "Properties of YBa$_2$Cu$_3$O$_{7-\delta}$ Thick Films on Flexible Buffered Metallic Substrates", *Appl. Phys. Lett.* 67(16) :2397–2399, 1995, (no month).

\* cited by examiner

BUFFER LAYERS ON BIAXIALLY TEXTURED METAL SUBSTRATES

CROSS-REFERENCE TO RELATED APPLICATIONS

This is a division of application No. 08/922,173, filed Sep. 2, 1997, now U.S. Pat. No. 6,077,344; and a continuation-in-part of patent application Ser. No. 08/419,583 filed Apr. 10, 1995, now U.S. Pat. No 5,741,377.

STATEMENT REGARDING FEDERALLY SPONSORED RESEARCH

This invention was made with United States Government support awarded by the Department of Energy to Lockheed Martin Energy Research Corporation, Contract No. DE-AC05-96OR22464. The United States Government has certain rights in this invention.

BACKGROUND OF THE INVENTION

1. Field of the Invention

This invention relates generally to the growth of a biaxially textured metal oxide buffer layer on metal substrates. More particularly, it relates to a sol-gel technique for growing such buffer layers on metal substrates.

2. Background of the Art

Biaxially textured metal oxide buffer layers on metal substrates are potentially useful in electronic devices where an electronically active layer is deposited on the buffer layer. The electronically active layer may be a superconductor, a semiconductor, or a ferroelectric material.

For example, superconducting wire to be used for power transmission lines has a multi-layer composition 10 (FIG. 1). Such deposited conductor systems consist of a metal substrate 11, buffer layer(s) 12, and a superconducting layer 13. The metal substrate, such as Ni, Ag, or Ni alloys, provides flexibility for the wire and can be fabricated over long lengths and large areas. Metal oxide buffer layers, such as $LaAlO_3$, $CeO_2$, or yttria-stabilized zirconia (YSZ), comprise the next layer and serve as chemical barriers between the metal substrate and the last layer, the high-temperature superconductor.

To achieve high critical current densities from the wire, it is important that the superconducting material be biaxially oriented and strongly linked. The orientation necessary begins with the texture of the metal substrate which must be maintained in the buffer layer and thus transferred to the superconductor. The conventional processes that are currently being used to grow buffer layers on metal substrates and achieve this transfer of texture are vacuum processes such as pulsed laser deposition, sputtering, and electron beam evaporation. Researchers have recently used such techniques to grow biaxially textured $YBa_2Cu_3O_x$ (YBCO) films on metal substrate/buffer layer samples that have yielded critical current densities between 700,000 and $10^6$ $A/cm^2$ at 77° K (A. Goyal, et al., "Materials Research Society Spring Meeting, San Francisco, Calif., 1996; X.D. Wu, et al., *Appl. Phys. Lett.* 67:2397, 1995). One drawback of such vacuum processes is the difficulty of coating long or irregularly-shaped substrates, and the long reaction times and relatively high temperatures required.

A further consideration during the fabrication process is the undesirable oxidation of the metal substrate (for example, when using Ni). If the Ni begins to oxidize, the resulting NiO will likely grow in the (111) orientation regardless of the orientation of the Ni (J.V. Cathcart, et al., *J. Electrochem. Soc.* 116:664, 1969). This (111) NiO orientation adversely affects the growth of biaxially textured layers and will be transferred, despite the substrate's original orientation, to the following layers.

Thus, it would be advantageous to have a process which avoids the above disadvantages of vacuum-based processes.

SUMMARY OF THE INVENTION

We have discovered a new non-vacuum based process by which biaxially textured buffer layers can be grown on metal substrates under conditions that reduce the potential for oxidation of the metal. This process also avoids the drawbacks of scaling up the prior art vacuum processes. This can be achieved using our novel sol-gel method described below.

Sol-gel is a technique where alkoxide solutions are spin-cast, dip-coated, or sprayed onto substrates in air. Sol-gel is advantageous because it is a relatively low-cost procedure, is capable of coating long length conductors or irregularly shaped substrates, and yields the desired orientation usually after shorter reaction times and lower temperatures than necessary in other processes.

One aspect of the invention provides a method of forming a buffer layer on a metal substrate, comprising the steps of: coating a biaxially oriented metal substrate with a sol-gel solution of a metal oxide; and heating the coated metal substrate in a reducing atmosphere under such conditions that the sol-gel solution forms a buffer layer which has an epitaxial orientation to that of the metal substrate. Preferably, the reducing atmosphere has low oxygen partial pressures (i.e., preferably no more than about 0.1% v/v). More preferably, the reducing atmosphere comprises an inert gas and hydrogen. Most preferably, the reducing atmosphere comprises argon and about 4% hydrogen.

The metal substrate is preferably selected from the group consisting of nickel, silver, copper, and non-magnetic substrates such as nickel alloys and copper alloys. The metal oxide of the sol-gel solution is preferably selected from the group consisting of alkaline earth zirconium oxides, lanthanum nickel oxide, yttrium europium oxide, strontium aluminum lanthanum tantalates, zirconium doped cerium oxide, cerium oxide, yttria-stabilized zirconia, strontium titanium oxide, lanthanum aluminum oxide, rare earth aluminum oxides, and yttrium aluminum oxides. Most preferably, the metal oxide of the sol-gel solution is lanthanum aluminum oxide or neodymium aluminum oxide.

Another aspect of the invention provides a method of making an electronic device, comprising the steps of: coating a biaxially oriented metal substrate with a sol-gel solution of a metal oxide; heating the coated substrate in a reducing atmosphere under such conditions that the sol-gel solution forms a buffer layer which has an epitaxial orientation to that of the metal substrate; and depositing an electronically active layer on the buffer layer. Preferably, the reducing atmosphere has low oxygen partial pressures (i.e., preferably no more than about 0.1% v/v). More preferably, the reducing atmosphere comprises an inert gas and hydrogen. Most preferably, the reducing atmosphere comprises argon and about 4% hydrogen. Advantageously, the electronically active layer can be superconductor, semiconductor, or ferroelectric materials.

The metal substrate is preferably selected from the group consisting of nickel, silver, copper, and non-magnetic substrates such as nickel alloys and copper alloys. The metal oxide of the sol-gel solution is preferably selected from the group consisting of alkaline earth zirconium oxides, lanthanum nickel oxide, yttrium europium oxide, strontium aluminum lanthanum tantalates, zirconium doped cerium oxide, cerium oxide, yttria-stabilized zirconia, strontium titanium oxide, lanthanum aluminum oxide, rare earth aluminum oxides, and yttrium aluminum oxides. Most preferably, the metal oxide of the sol-gel solution is lanthanum aluminum oxide or neodymium aluminum oxide.

A further aspect of the invention provides a metal having a biaxially oriented buffer layer and a superconductor made by methods of the above kind.

The objects of the invention, therefore, include providing a method of the above kind:

(a) which avoids the metal substrate oxidation problems of the prior art;

(b) which offers a relatively low cost procedure for coating long length conductors or irregularly shaped substrates;

(c) which yields the desired phase on the buffer layer with shorter reaction times and lower temperatures than necessary in the prior art; and (d) which allows the orientation of the texture of the metal substrate to be maintained in the buffer layer and thus transferred to the electronically active layer.

These and still other objects and advantages of the present invention will be apparent from the description below. However, this description is only of the preferred embodiments. The claims should, therefore, be looked to in order to assess the whole scope of the invention.

DETAILED DESCRIPTION OF THE INVENTION

Figure 1:
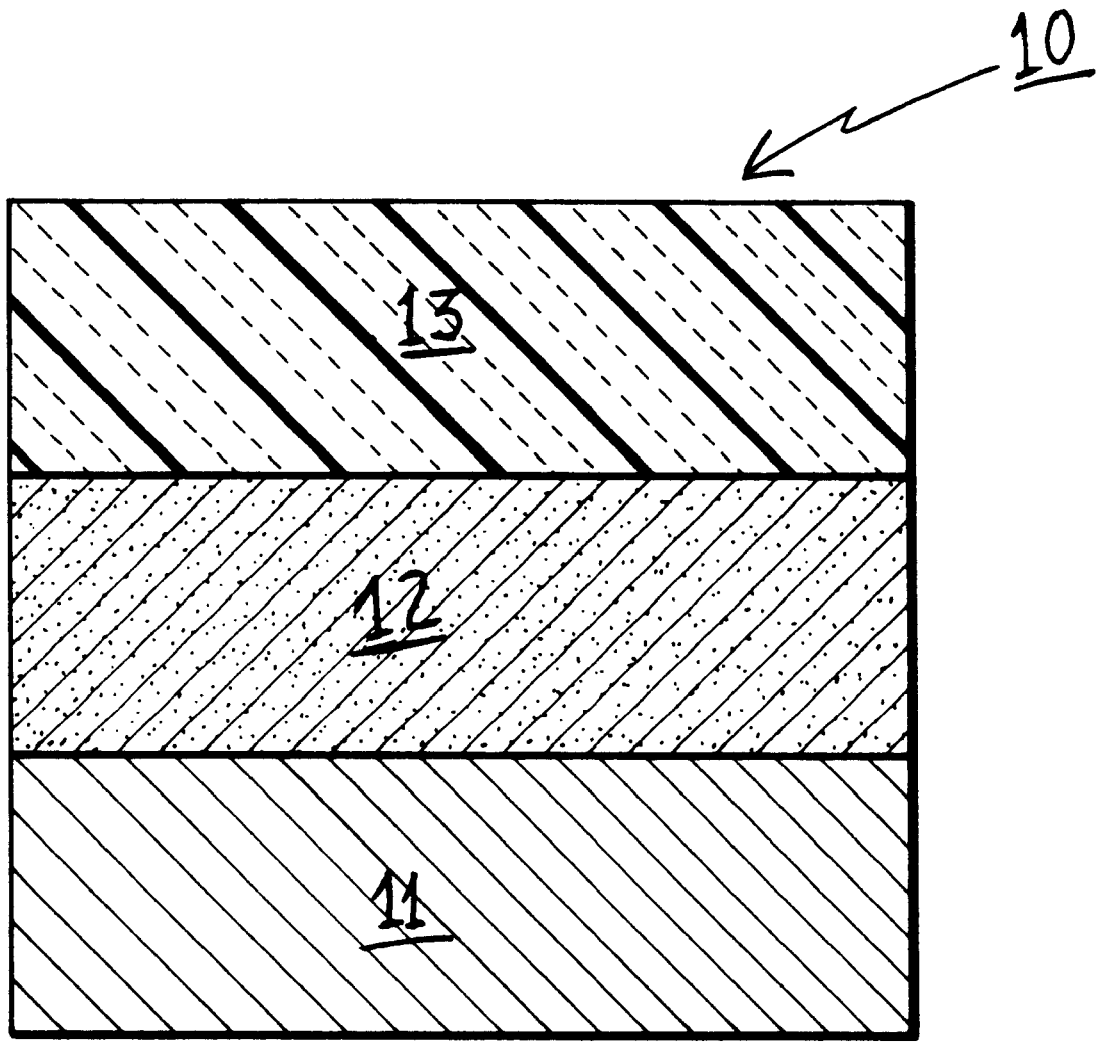
FIG. 1 shows a schematic drawing of the layer structure of a typical superconducting wire.

A biaxially textured film of a metal oxide buffer layer, specifically lanthanum aluminum oxide ($LaAlO_3$), was grown on a rolled, biaxially textured Ni substrate using sol-gel, a non-vacuum technique. By pyrolyzing and annealing in a reducing atmosphere of Ar/4% $H_2$ (v/v), the possibility of oxidizing the metal substrate is eliminated. The discussion below describes the heat treatment and reaction atmosphere used to grow the film. These conditions were appropriate for yielding the desired (100) crystallographic orientation of $LaAlO_3$. X-ray diffraction results are given to verify the epitaxy of the resulting film. It should be noted that by epitaxy we mean that the crystalline orientations of the deposited layers bear fixed relationships to the crystalline orientation of the substrate.

These biaxially textured buffer layer films can be used as substrates on which to grow chemically compatible electronic materials. For example, the properties of high temperature superconductors, including rare earth barium copper oxide (REBCO), thallium barium calcium copper oxide ($TlBa_2Ca_{n-1}Cu_nO_{2n+3}$, n=1–4 and $Tl_2Ba_2Ca_{n-1}Cu_nO_{2n+4}$, n=1–3), and mercury barium calcium copper oxide ($HgBa_2Ca_{n-1}Cu_nO_{2n+2+\delta}$,n=1–4), would be improved by epitaxial deposition on these buffer layers. The sol-gel technique by which $LaAlO_3$ and $NdAlO_3$ films were grown establishes a non-vacuum technique for the growth of biaxially textured buffer layers on metal substrates and creates the expectation that other buffer layers, such as cerium oxide ($CeO_2$), yttria-stabilized zirconia (YSZ), strontium titanium oxide ($SrTiO_3$), or other $REAlO_3$ (RE=rare earth), can be grown in the same manner.

1. Coating Procedure

The Ni substrates used were thermo-mechanically textured (A. Goyal, et al., *Appl. Phys. Lett.* 69(12):1795–1797 (1996)) and ultrasonically cleaned in ethanol for 30 minutes prior to coating. The biaxial texture was achieved, for example, by cold rolling high purity (99.99%) nickel rod in a rolling mill until the length of the rod had been increased by a factor of ~20 (deformation was over 95%). The desired texture (100) was developed by recrystallization of the rolled Ni at 800° C. for 120 minutes at a pressure less than $10^{-7}$ torr. One coating of the partially hydrolyzed $LaAlO_3$ precursor solution (S.S. Shoup, et al., "Growth of Epitaxial $LaAlO_3$ and $CeO_2$ Films Using Sol-Gel Precursors", Proc. of the 10th Anniv. HTS Workshop on Physics, Materials, and Applications, Houston, Tex., 1996; S.S. Shoup, et al., *J. Mater. Res.* 12(4):1017–1021, 1997) was applied to the substrate via a syringe and 0.2 $\mu$filter. The substrate was then spun-using a photo-resist spinner operated at 2,000 rpm for 45 seconds.

2. Heat Treatment

The coated metal substrate was placed in an alumina boat which was situated at the end of an alumina tube. The tube was equipped with a gas connection to allow Ar/4% $H_2$ to be maintained around the sample during the heat treatment and thus eliminate the potential for the Ni substrate to oxidize. The tube was purged with Ar/4%$H_2$ for 20 minutes prior to the beginning of the heat treatment to remove air from the tube. Then the tube was placed in a pre-heated tube furnace at 1150° C. After one hour of pyrolysis and annealing in the Ar/4%$H_2$ atmosphere at 1150° C., the tube was removed from the furnace. The reducing atmosphere was maintained around the sample as it was quickly cooled (in approximately 30 minutes). Once the sample had cooled to room temperature, the tube was opened to air, and the sample was removed. The resulting $LaAlO_3$ film obtained was yellow-gold in color and approximately 1000 Å thick.

Hydrogen containing atmospheres are the preferred atmospheres for the heat treatment of the coated substrates, with 4% v/v hydrogen in argon, helium, or nitrogen the most preferred atmosphere for safety reasons. Mixtures of 2 to 6% v/v hydrogen are commonly referred to as "forming gas" and are not generally combustible under most conditions. Carbon monoxide/carbon dioxide mixtures are also commonly used as gaseous reducing agents.

3. XRD Characterization

Figure 2:
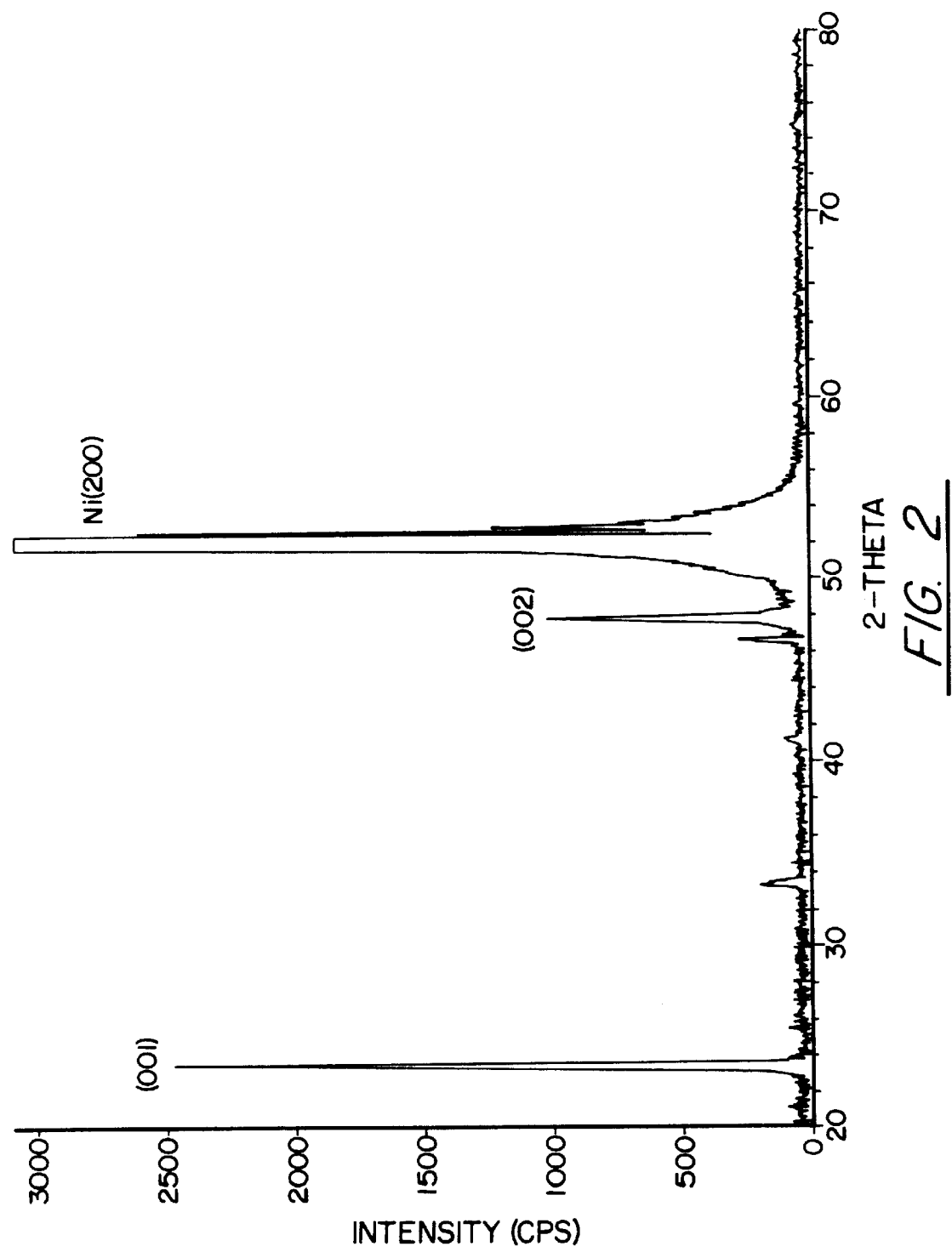
FIG. 2 shows a theta-2-theta scan of c-axis oriented $LaAlO_3$ on Ni(100)
Figure 3:
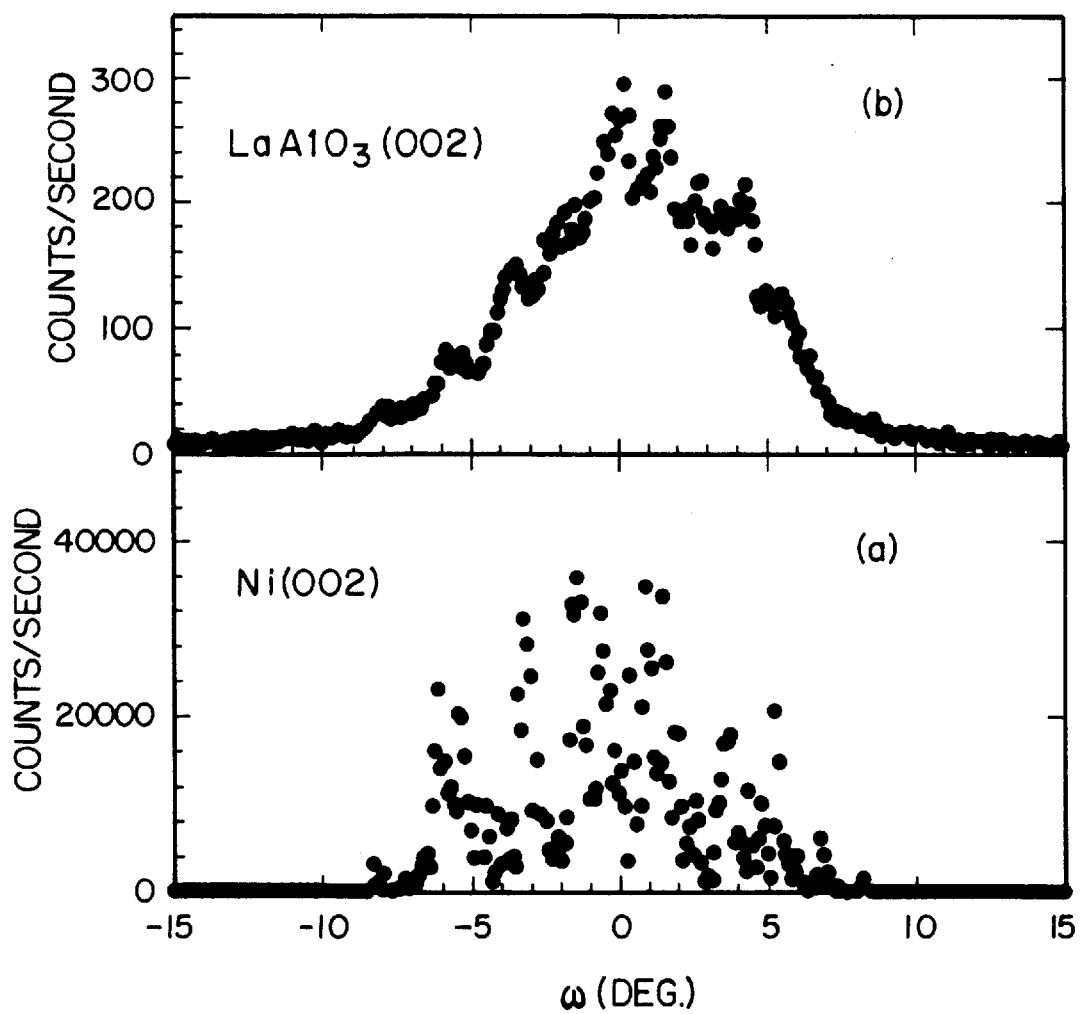
FIGS. 3a and 3b show a rocking curve of the (002) Ni reflection and a rocking curve of the (002) $LaAlO_3$ reflection (FWHM=7.2°), respectively.
Figure 4:
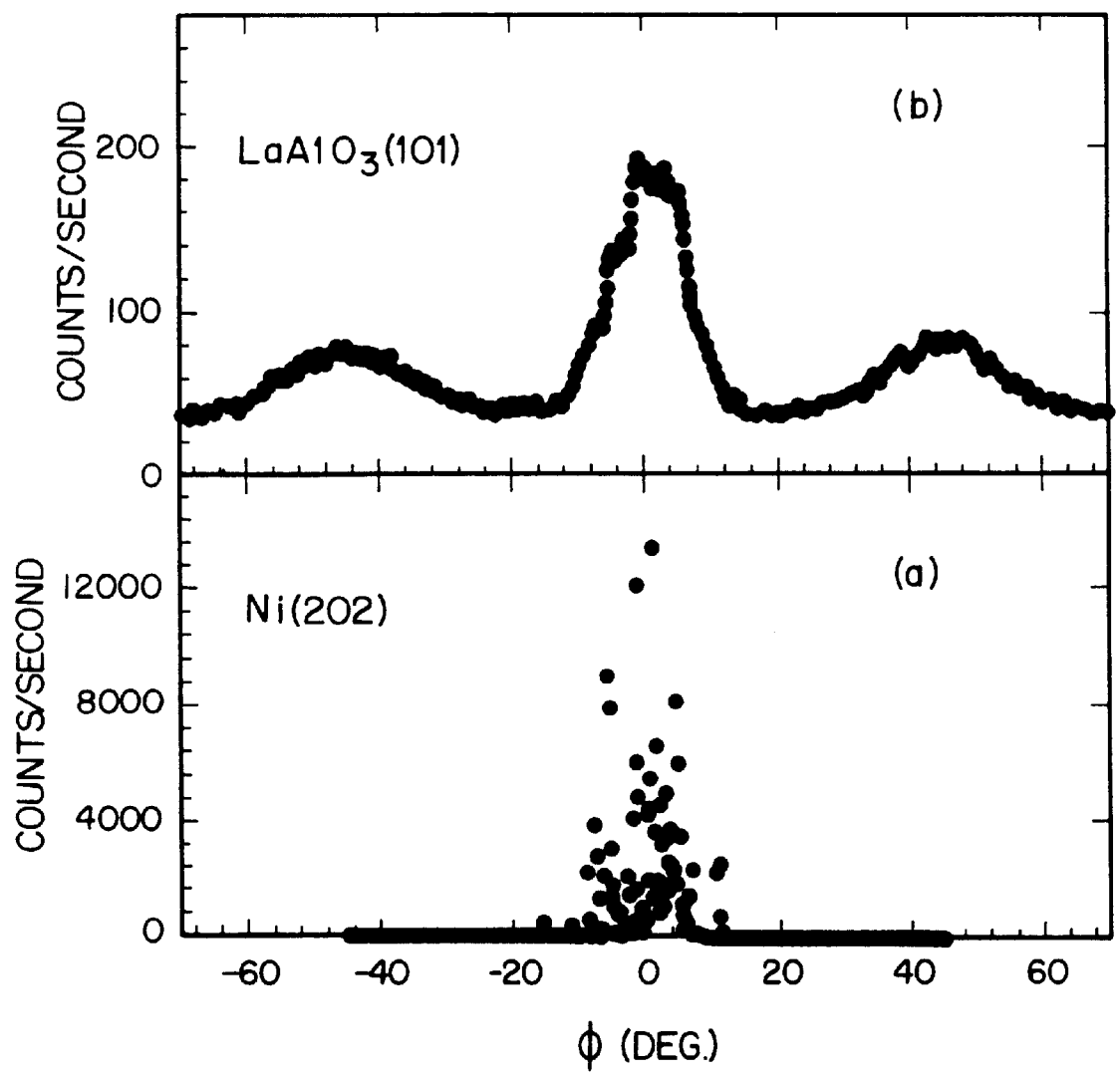
FIGS. 4a and 4b show a phi scan of the (202) Ni reflection and a phi scan of the (101) $LaAlO_3$ reflection (FWHM= 13.4°), respectively.
Figure 5:
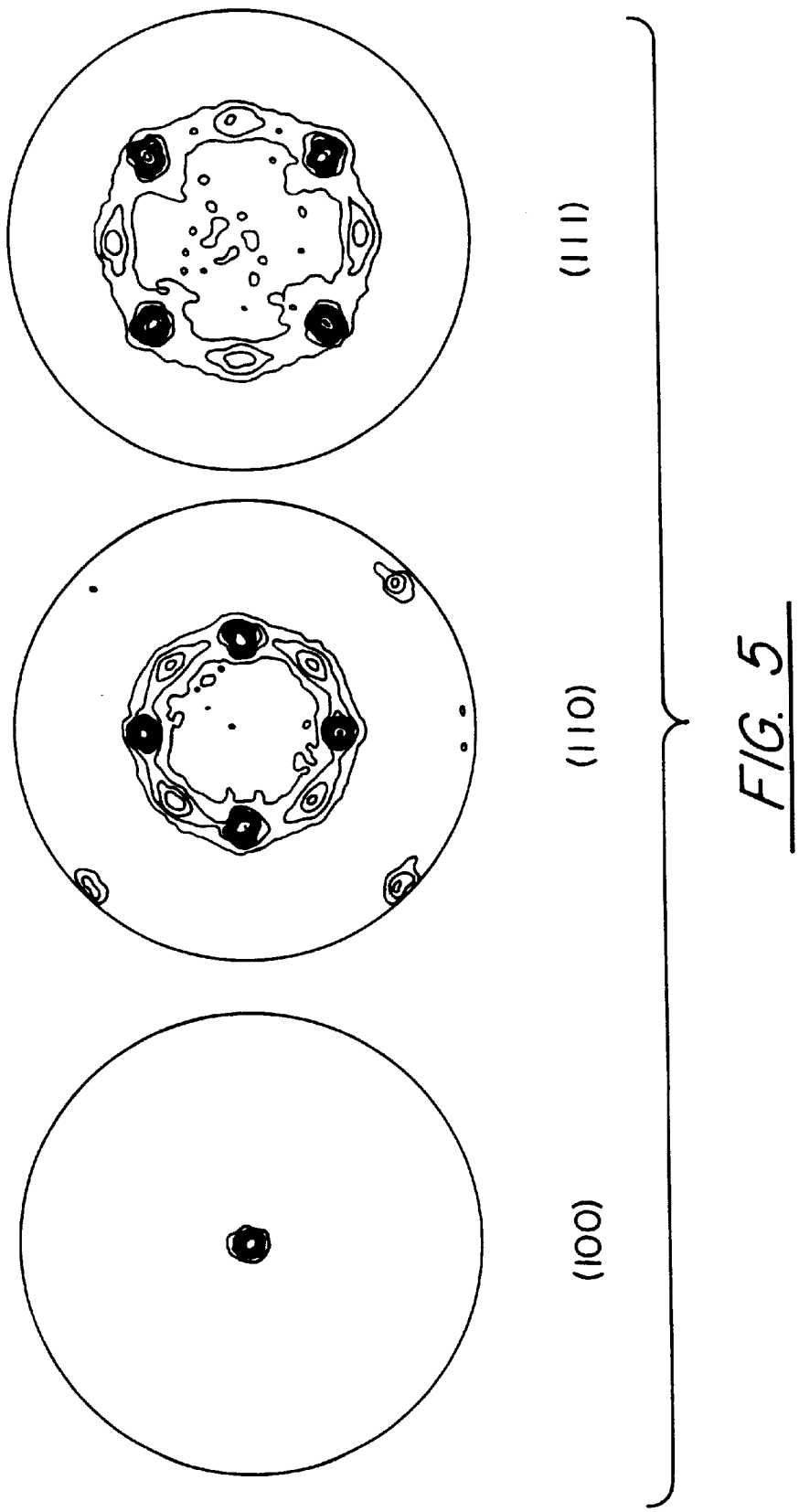
FIG. 5 is a pole figure from $LaAlO_3$ (100), (110), and (111)

The x-ray diffraction (XRD) pattern of the epitaxial $LaAlO_3$ on Ni obtained at room temperature is shown in FIG. 2 and indicates that there is a c-axis preferred growth with the (001) lattice reflection peaks of greater intensity than the (110) peak which is the most intense for random $LaAlO_3$. Out-of-plane and in-plane angle determinations were made with omega and phi scans. The film had good out-of-plane orientation with a rocking curve of the (002)

reflection yielding a full-width-at-half-maximum (FWHM)= 7.2° (FIG. 3). Good in-plane orientation was indicated by a phi scan of the (101) plane with FWHM=13.4° (FIG. 4). Pole figure analyses of the (100), (110), and (111) reflections indicate little random component apart from the two orientations in the plane [(101) and (110)] (FIG. 5). The lattice parameters for the $LaAlO_3$ film were calculated to be a (in-plane)=3.7635(10) Å and c (out-of plane)=3.8134 (10) Å. The c/a value of the film is 1.013 and indicates a 1.3% substrate-induced distortion which is much larger than the 0.2% rhombohedral distortion found in bulk $LaAlO_3$. This large distortion may be the origin of the two-in-plane orientations.

Figure 6:
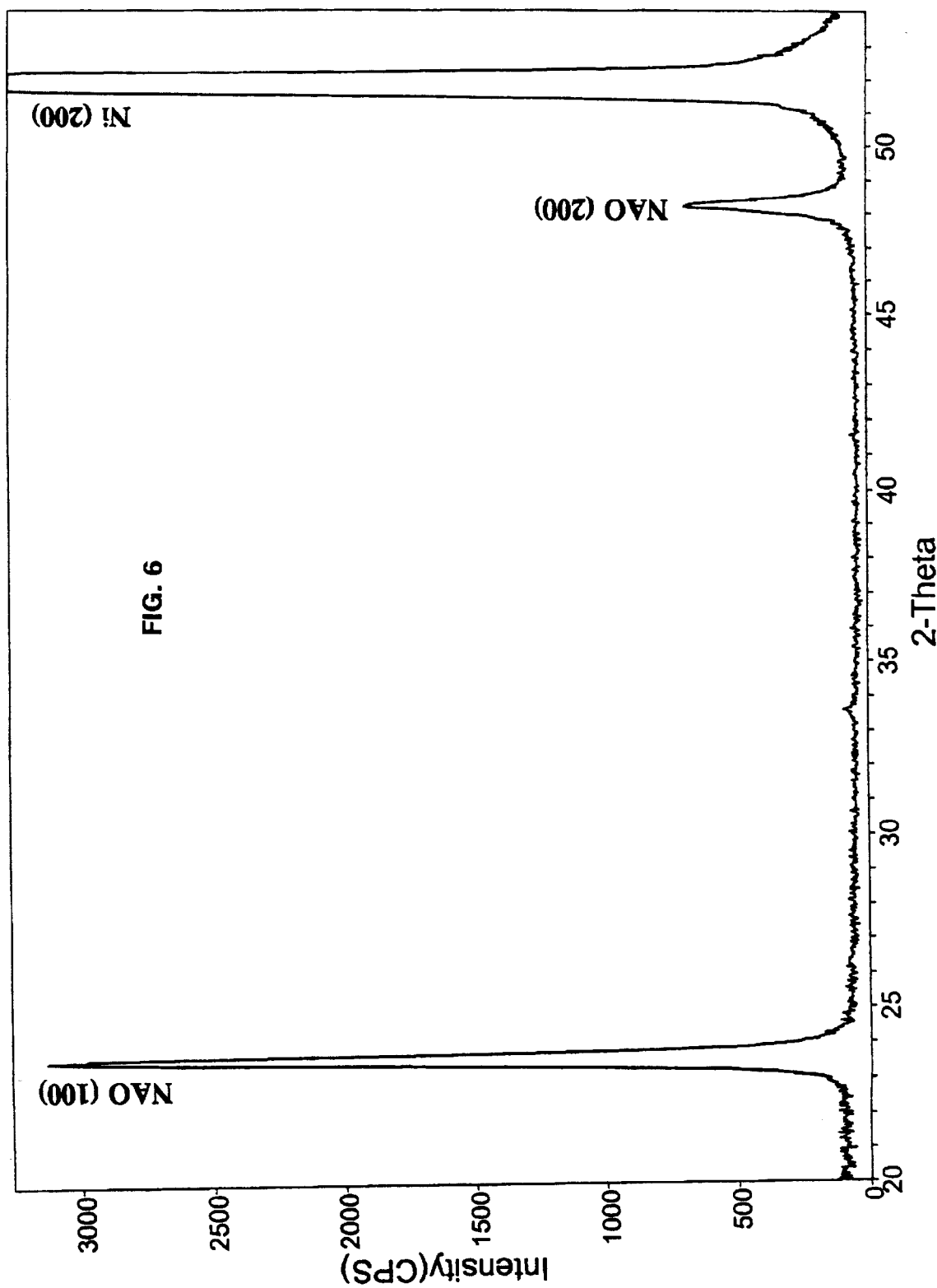
FIG. 6 is a XRD theta-two-theta scan of a c-axis oriented $NdAlO_3$ on biaxially textured Ni (100)
Figure 7:
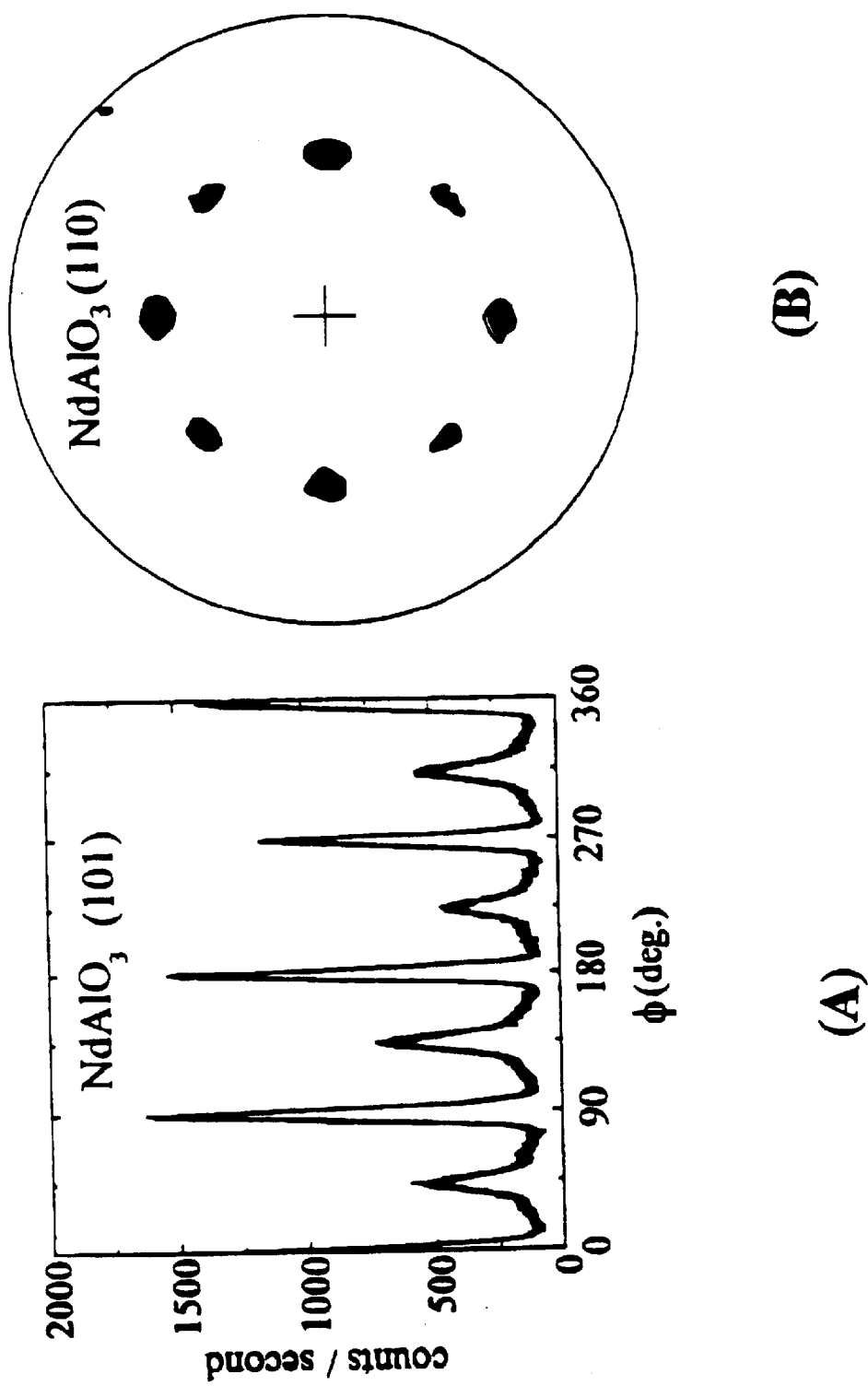
FIGS. 7a and 7b are a Ω scan of the (101) $NdAlO_3$ reflection (FWHM=8.8°) and a XRD (110) pole figure of $NdAlO_3$ on textured Ni, respectively.

4. Additional Experiments $NdAlO_3$ was deposited by a sol-gel process on a biaxially textured Ni substrate using the procedures described above (coating procedure; heat treatment; XRD characterization). FIG. 6 shows that the $NdAlO_3$ buffer layer is c-axis aligned. FIG. 7 shows that the $NdAlO_3$ buffer layer was grown epitaxially with two in-plane orientations on roll-textured nickel.

The processing temperatures and times in $Ar/H_2$ can be optimized for the growth of biaxially textured $CeO_2$, YSZ, $SrTiO_3$, or other $LnAlO_3$ on Ni and $LnAlO_3$ on different architectures of metal oxide and metal buffer layers deposited by vacuum processes. Sol-gel deposition of buffer layers can be used in conjunction with vacuum deposition of buffer layers. Vacuum processing is defined as e-beam evaporation, sputtering, or pulsed laser ablation. Our current structure uses layers of cerium oxide followed by yttria-stabilized zirconia deposited by e-beam evaporation. It may be desirable to deposit by sol-gel a layer of third material which gives the buffer layers structure better chemical compatibility. For example, rare-earth aluminates, which are difficult to deposit by vacuum processing, have superior barrier properties at high temperatures as compared to ceria and zirconates. We have been successful in growing epitaxial $GdAlO_3$ on single crystal (100) $SrTiO_3$ in $O_2$.

Because it is a non-vacuum technique, the above method for growing biaxially textured buffer layers on metal substrates has many advantages over more conventional buffer layer deposition processes both of which achieve strong texture on metals (K. Kushida, et al., *J. Amer. Ceram. Soc.* 76:1345, 1993). This invention demonstrates specifically that $LaAlO_3$ can be grown epitaxially on a metal using a sol-gel method. These epitaxial films are superior to the textured, but nonepitaxial $LaAlO_3$ layers grown on single crystal substrates using a different sol-gel and heat treatment as described by P. Peshev and V. Slavov, *Mater. Res. Bull.* 29:255, 1994. The process of the invention is also better than that used to specifically grow highly textured or epitaxial $LaAlO_3$ films on single crystal substrates by a vacuum technique, such as sputtering (A. E. Lee, et al., *Appl. Phys. Lett.* 57:2019, 1990; V. Sandu, et al., *J. Mater. Sci. Lett.* 13:1222, 1994). The sol-gel process is also relatively inexpensive and more practical than some of the vacuum processes when considering scale-up to coat long length conductors for power transmission lines.

This invention can be adapted for growing other biaxially textured buffer layers, such as $CeO_2$, YSZ, $SrTiO_3$, or $REAlO_3$, on metal substrates by altering the processing conditions.

We expect that the practical use of this invention will involve the sol-gel deposition of a metal oxide under reducing conditions followed by the sol-gel deposition of other oxide layers, under either reducing or oxidizing conditions, to tailor the properties of the substrate to better match those of the superconducting layer. These properties would include lattice parameter, chemical compatibility, and coefficient of thermal expansion.

The deposition of lanthanum aluminate on nickel at 1150° C. under reducing conditions can be followed by deposition of barium zirconate at lower temperatures (750° C.) under oxidizing conditions. This would "seal", any cracks in the lanthanum aluminate layer caused by strain during cooling (lanthanum aluminate and nickel have significantly different coefficients of thermal expansion and crack formation in the buffer layer could be a significant reliability issue).

What is claimed is:

1. A composite material comprising a metal oxide buffer layer on a biaxially-oriented metal substrate, the buffer layer having an epitaxial orientation to that of the metal substrate.

2. The composite material of claim 1, wherein the metal oxide is selected from the group consisting of cerium oxide, yttria-stabilized zirconia, strontium titanium oxide, lanthanum aluminum oxide, rare earth aluminum oxides, yttrium aluminum oxides, alkaline earth zirconium oxides, lanthanum nickel oxide, yttrium europium oxide, strontium aluminum lanthanum tantalates, and zirconium doped cerium oxide.

3. An electronic device comprising an electronically active layer deposited on the buffer layer of the composite material of claim 1.

4. An electronic device comprising an electronically active layer deposited on the buffer layer of the composite material of claim 2.

5. The composite of claim 1, wherein the metal oxide buffer layer is formed by coating the metal substrate with a sol-gel solution of the metal oxide and heating the coated metal substrate in a reducing atmosphere under such conditions that the sol-gel solution forms a buffer layer having an epitaxial orientation to that of the metal substrate.

* * * * *